(12) United States Patent
Senba et al.

(10) Patent No.: US 6,191,482 B1
(45) Date of Patent: *Feb. 20, 2001

(54) SEMICONDUCTOR CHIP CARRIER HAVING PARTIALLY BURIED CONDUCTIVE PATTERN AND SEMICONDUCTOR DEVICE USING THE SAME

(75) Inventors: Naoji Senba; Nobuaki Takahashi, both of Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/062,657

(22) Filed: Apr. 20, 1998

(30) Foreign Application Priority Data

Apr. 21, 1997 (JP) ...................................... 9-103089

(51) Int. Cl.⁷ ..................................... H01L 23/48
(52) U.S. Cl. ......................... 257/737; 257/529; 257/778
(58) Field of Search ................... 257/690, 529, 257/697, 700, 737, 738

(56) References Cited

U.S. PATENT DOCUMENTS

| 4,847,146 | * | 7/1989 | Yeh et al. | 428/332 |
| 5,541,814 | * | 7/1996 | Janai et al. | 361/778 |
| 5,886,877 | * | 3/1999 | Shingai et al. | 361/768 |

FOREIGN PATENT DOCUMENTS

| 1-289274 | 11/1989 | (JP) . |
| 6-97229 | 4/1994 | (JP) . |

* cited by examiner

*Primary Examiner*—Olik Chaudhuri
*Assistant Examiner*—Douglas A. Wille
(74) *Attorney, Agent, or Firm*—Young & Thompson

(57) ABSTRACT

A semiconductor chip is mounted on a semiconductor chip carrier through a flip chip bonding technique; the semiconductor chip carrier includes an insulating layer such as synthetic resin having a mounting area assigned to the semiconductor chip and a conductive pattern having pads bonded to bumps of the semiconductor chip, and only the pads are formed in the mounting area so that melted synthetic resin smoothly flows into the gaps between the insulating synthetic resin layer and the semiconductor chip.

18 Claims, 8 Drawing Sheets

SEMICONDUCTOR CHIP CARRIER HAVING PARTIALLY BURIED CONDUCTIVE PATTERN AND SEMICONDUCTOR DEVICE USING THE SAME

FIELD OF THE INVENTION

This invention relates to a packaging technology for a semiconductor chip and, more particularly, to a semiconductor chip carrier and a semiconductor device using the same.

DESCRIPTION OF THE RELATED ART

A typical example of the semiconductor chip carrier 1 is illustrated in FIGS. 1 to 4. The prior art semiconductor chip carrier 1 comprises an insulating layer 2a and a conductive pattern 3 formed on an upper surface 2b of the insulating layer 2a. The insulating layer 2a is formed of synthetic resin such as polyimide, and through-holes 2c are formed in the insulting layer 2a. The upper surface 2b has a mounting area assigned to a semiconductor chip 4 and a peripheral area around the mounting area.

The conductive pattern 3 is formed of copper, and includes pads 3a, outer strips 3b, vertical connections 3c and a mesh sub-pattern 3d. The pads 3a are formed in the mounting area, and are connected to bumps 4a of the semiconductor chip 4. The outer strips 3b extend from the pads 3a toward the through holes 2c, and are merged with the vertical connections 3c. The vertical connections 3c passes through the through-holes 2c, and are exposed to the lower surface 2d of the insulating layer 2a. The mesh sub-pattern 3d is formed in the mounting area 3d, and most of the conductive pattern 3 is covered with a protective layer 5 of solder resist or glass.

Synthetic resin is injected into the gap between the semiconductor chip 4 and the protective resin 5, and forms a synthetic resin layer 6. The conductive pattern 3 is 10 microns to 15 microns thick, and the protective layer 5 is 5 microns to 15 microns thick. The protective layer 5 on the conductive pattern 3 measures 30 microns high from the upper surface of the insulating resin layer 2d at the maximum, and the gap GP1 between the protective layer 5 and the lower surface of the semiconductor chip 4 is only 0 to 15 microns. For this reason, while the manufacturer is injecting the melted synthetic resin into the space between the semiconductor chip carrier 1 and the lower surface of the semiconductor chip 4, the melted synthetic resin 6 and filler 7 hardly flow through the narrow gap GP1, and void 8 takes place in the synthetic resin layer 6 as shown in FIGS. 3 and 4. The void 8 is causative of cracks, and the cracks deteriorate the prior art semiconductor device.

If the conductive pattern 3 is formed inside, the obstacle to the penetration is removed between the semiconductor chip carrier 1 and the semiconductor chip 4. However, the semiconductor chip carrier loses a selecting function for disabling a certain circuit component of the integrated circuit. The conductive pattern 3 usually has a selecting sub-pattern, and the manufacturer selectively breaks the selecting sub-pattern by using a laser light radiation or a sand blustering. If the conductive pattern 3 is formed inside of the insulating layer 2a, it is not easy to disable a circuit component through the selective breakage of the selecting sub-pattern.

SUMMARY OF THE INVENTION

It is therefore an important object of the present invention to provide a semiconductor chip carrier, which allows sealant to smoothly flow into a gap under a semiconductor chip.

It is also an important object of the present invention to provide a semiconductor device, in which a semiconductor chip carrier is incorporated.

To accomplish the object, the present invention proposes to ensure that a conductive pattern is not present in a mounting area, except for pads to be bonded to a semiconductor chip.

In accordance with one aspect of the present invention, a semiconductor chip carrier for mounting a semiconductor chip is provided wich comprises an insulating layer, including a mounting area assigned to the semiconductor chip, and a peripheral area contiguous to the mounting area, and a conductive pattern including conductive pads exposed to the mounting area so as to be connected to conductive pieces of the semiconductor chip, a circuit sub-pattern electrically connected to the pads and assigned to the outside of the mounting area, except for a connecting portion merged with the pads and another sub-pattern formed in the peripheral area and evacuated from the mounting area.

In accordance with another aspect of the present invention, a semiconductor device comprising a semiconductor chip is provided on which a plurality of circuit components form an electric circuit, and a semiconductor chip carrier including an insulating layer including a mounting area assigned to the semiconductor chip and a peripheral area contiguous to the mounting area, and a conductive pattern including conductive pads exposed to the mounting area so as to be connected to conductive pieces of the semiconductor chip, a circuit sub-pattern electrically connected to the pads and assigned to the outside of the mounting area except for a connecting portion merged with the pads, and another sub-pattern formed in the peripheral area and not in the mounting area.

BRIEF DESCRIPTION OF THE DRAWINGS

The features and advantages of the semiconductor chip carrier and the semiconductor device will be more clearly understood from the following description taken in conjunction with the accompanying drawings in which.

DESCRIPTION OF THE PREFERRED EMBODIMENTS

Figure 1:
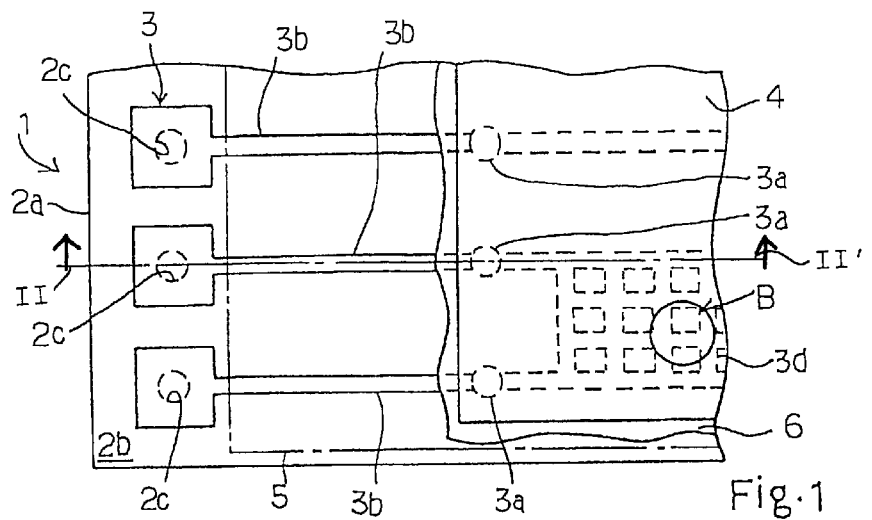
FIG. 1 is a plan view showing the layout of the prior art semiconductor chip carrier together with the semiconductor chip.
Figure 2:
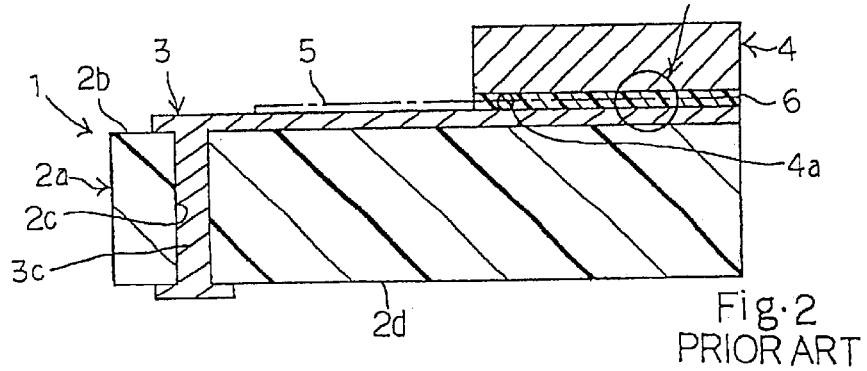
FIG. 2 is a cross sectional view taken alone line II–II' of FIG. 1 and showing the structure of the prior art semiconductor chip carrier.
Figure 3:
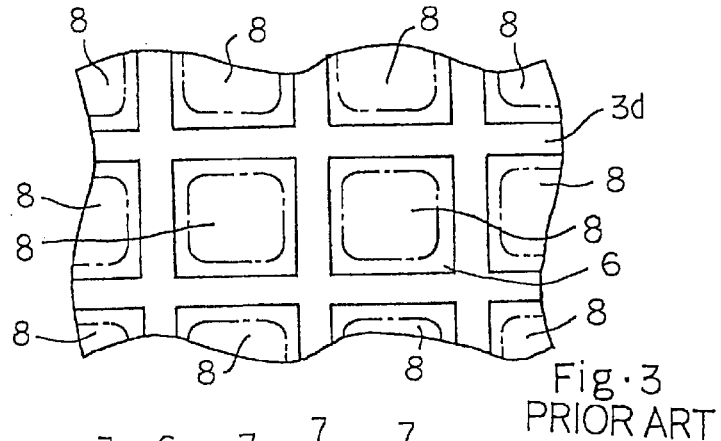
FIG. 3 is a plan view showing the mesh pattern formed on the prior art semiconductor chip carrier.
Figure 4:
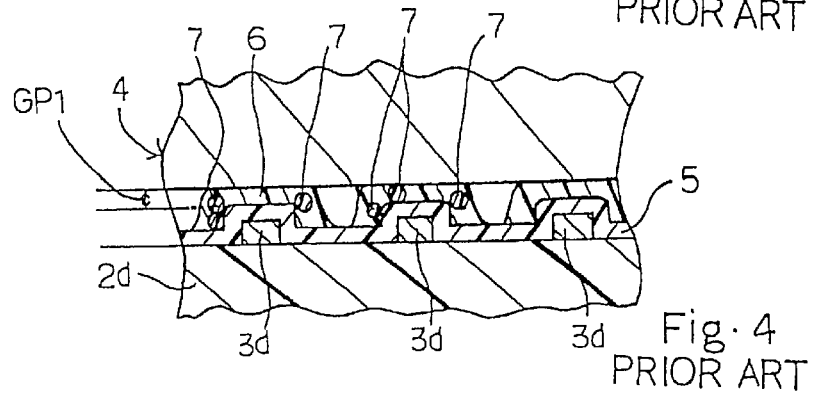
FIG. 4 is a cross sectional view showing the boundary between the semiconductor chip and the prior art semiconductor chip carrier.
Figure 5:
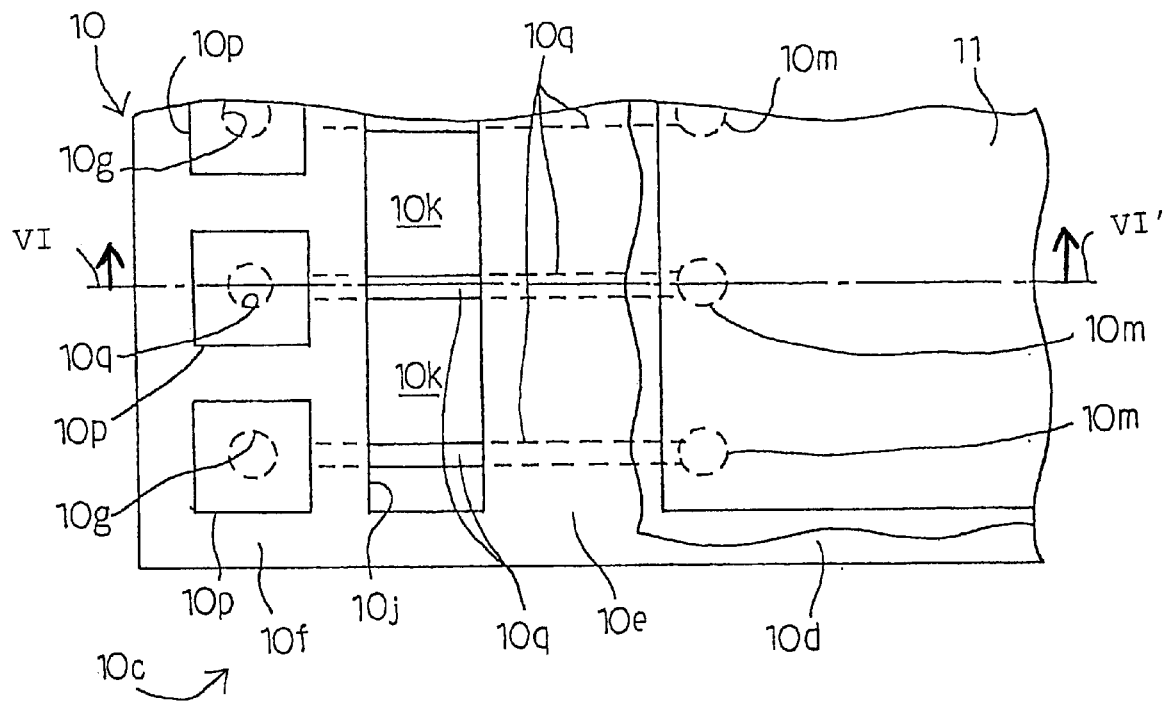
FIG. 5 is a plan view showing the layout of a semiconductor device according to the present invention.
Figure 6:
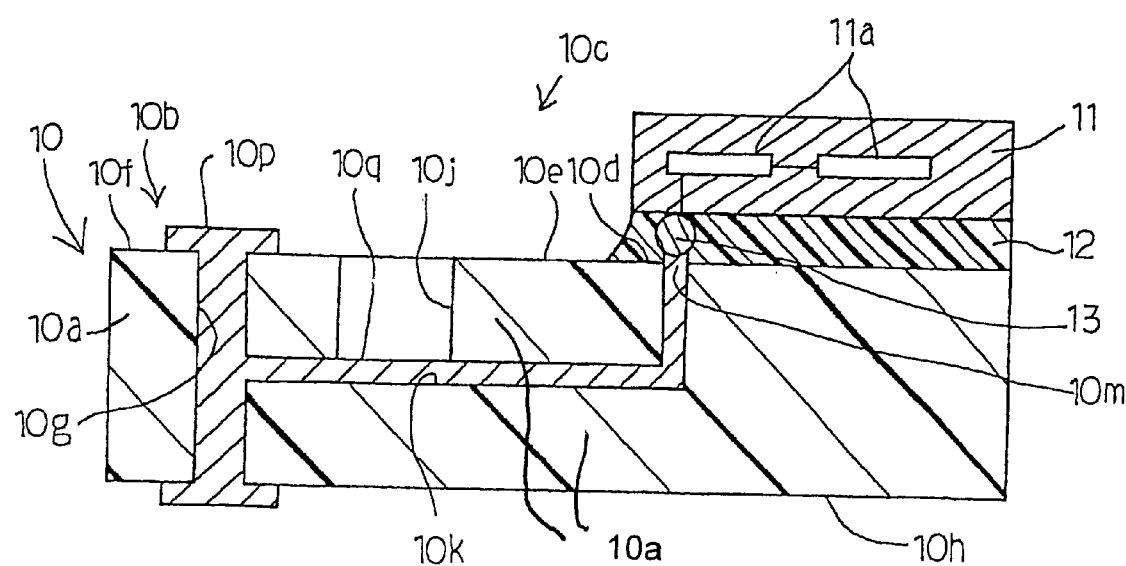
FIG. 6 is a cross sectional view taken along line VI–VI' of FIG. 5 and showing the structure of the semiconductor device.

Referring to FIGS. 5 and 6 of the drawings, a semiconductor device embodying the present invention comprises a semiconductor chip carrier 10, a semiconductor chip 11 mounted on the semiconductor chip carrier 10, and a synthetic resin layer 12 between the semiconductor chip carrier 10 and the semiconductor chip 11.

A plurality of circuit components 11a are fabricated in the semiconductor chip 11, and form an electric circuit.

The semiconductor chip carrier 10 includes an insulating layer 10a such as synthetic resin and a conductive pattern 10b. The insulating resin layer 10a has a major surface 10c, and the major surface 10c is divided into a mounting area 10d, an inner peripheral area 10e and an outer peripheral area 10f. The mounting area 10d is assigned to the semiconductor chip 11, and the semiconductor chip 11 is mounted on the mounting area 10d. The outer peripheral area 10f is assigned to through-holes 10g, and the through-holes 10g are open to the major surface 10c and a reverse surface 10h. A rectangular window 10j is formed in the inner peripheral area 10e, and an inner surface 10k is exposed to the rectangular window 10j.

The conductive pattern 10b includes pads 10m, vertical interconnections 10p and a circuit sub-pattern 10q connected between the vertical interconnections 10p and the pads 10m. The pads 10m are arranged in the mounting area 10d, and are connected to bumps 13 under the semiconductor chip 11. The bumps 13 are connected to the electric circuit of the semiconductor chip 11. An integrated circuit is fabricated on the semiconductor chip 11, and is electrically connected through the bumps 13 to the pads 10m. The pads 10m vertically penetrate from the mounting area 10d into the insulating resin layer 10a, and reach the same level as the inner surface 10k. No other conductive pattern is exposed to the mounting area 10d.

The vertical interconnections 10p pass the through-holes 10g, and expose the upper surfaces and the lower surfaces to the major surface and the reverse surface 10c/10h. The circuit sub-pattern 10q is connected between the vertical interconnections 10p and the pads 10m, and is partially exposed to the rectangular window 10j. The synthetic resin layer 12 does not reach the rectangular window 10j, and the rectangular window 10j is not filled with the synthetic resin 12. In this instance, the vertical interconnections 10p as a whole, constitute another sub-pattern.

Figure 7A:
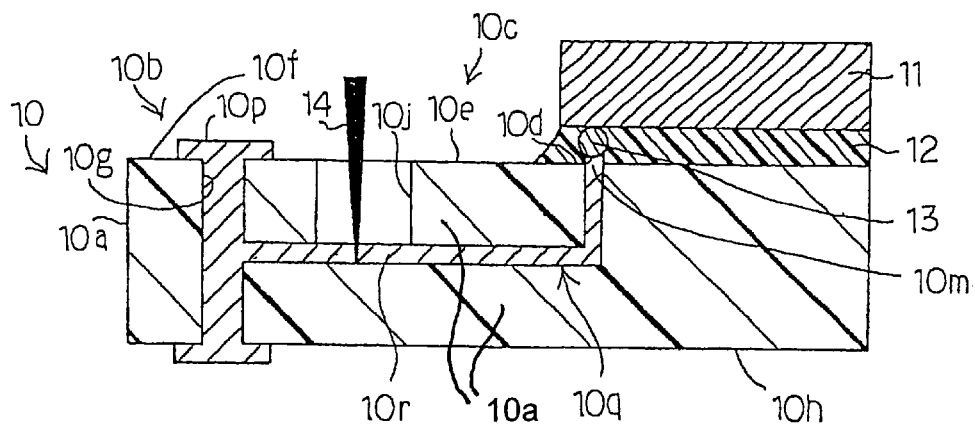
FIGS. 7A to 7C are cross sectional views showing a process for fabricating the semiconductor device.
Figure 7B:
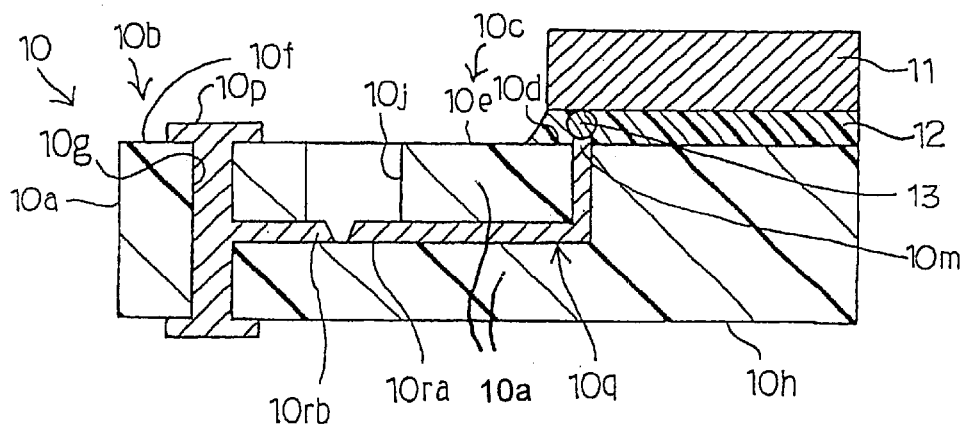
Figure 7C:
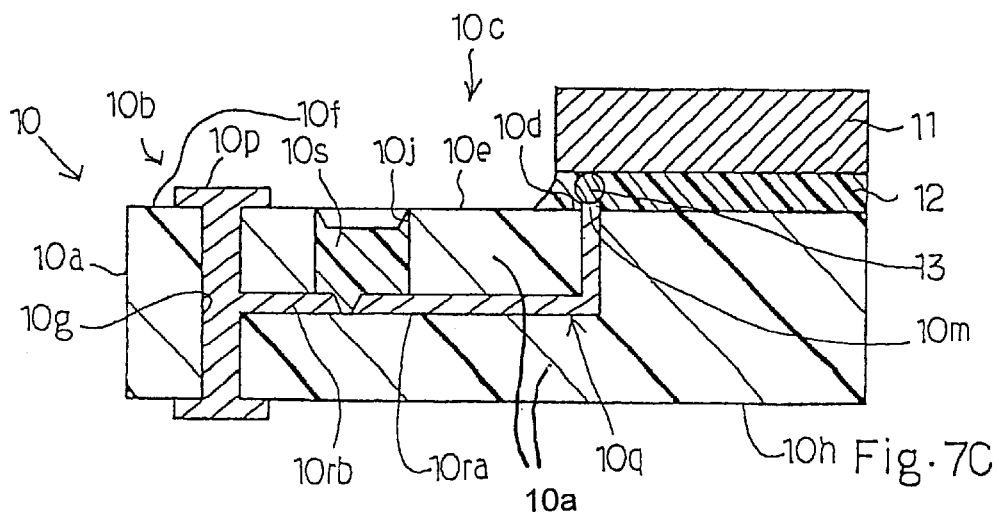

The semiconductor device is fabricated through a process shown in FIGS. 7A to 7C. First, the bumps 13 are aligned with the pads 10m, and are bonded thereto by using a flip chip bonding technique. After the mounting, melted synthetic resin is injected into the gap between the insulating resin layer mounting area 10d and the lower surface of the semiconductor chip 11. The melted synthetic resin smoothly penetrates into the gap, because only the bumps 13 and the pads 10m are in the gap. Therefore, a void is not formed in the synthetic resin layer 12.

Subsequently, the manufacturer selectively disables circuit components of the integrated circuit, if necessary. As previously described, the circuit sub-pattern 10q is partially exposed to the rectangular window 10j, and the rectangular window 10j is not filled with the synthetic resin. The manufacturer selects a certain conductive portion 10r of the circuit sub-pattern connected between the circuit component to be disabled and the associated vertical interconnection 10p. A laser beam 14 is radiated from a suitable laser light source (not shown) to the selected conductive portion 10r as shown in FIG. 7A, and breaks the conductive portion 10r into two sub-portions 10ra and 10rb as shown in FIG. 7B. The sub-portions 10ra and 10rb are not electrically connected to each other, and the disconnection makes the selected circuit component disabled.

Subsequently, melted synthetic resin is supplied to the rectangular window 10j, and the exposed portion of the circuit sub-pattern 10q is sealed in the piece of synthetic resin 10s as shown in FIG. 7C. The piece of synthetic resin prevents the circuit sub-pattern 10q from contamination and deterioration of the circuit sub-pattern 10q due to a migration of metal.

As will be understood from the foregoing description, the conductive pattern 10b is buried under the major surface 10c except for the pads 10m, and the melted synthetic resin is smoothly injected into the gap between the insulating resin layer 10a and the lower surface of the semiconductor chip 11. As a result, void is not formed in the synthetic resin layer 12, and the synthetic resin layer 12 and the semiconductor chip 11 are not cracked. The circuit sub-pattern 10q is partially exposed to the window 10j, and is not covered with the synthetic resin layer 12. For this reason, the manufacturer can easily achieve the selecting function through the window 10j.

Figure 8:
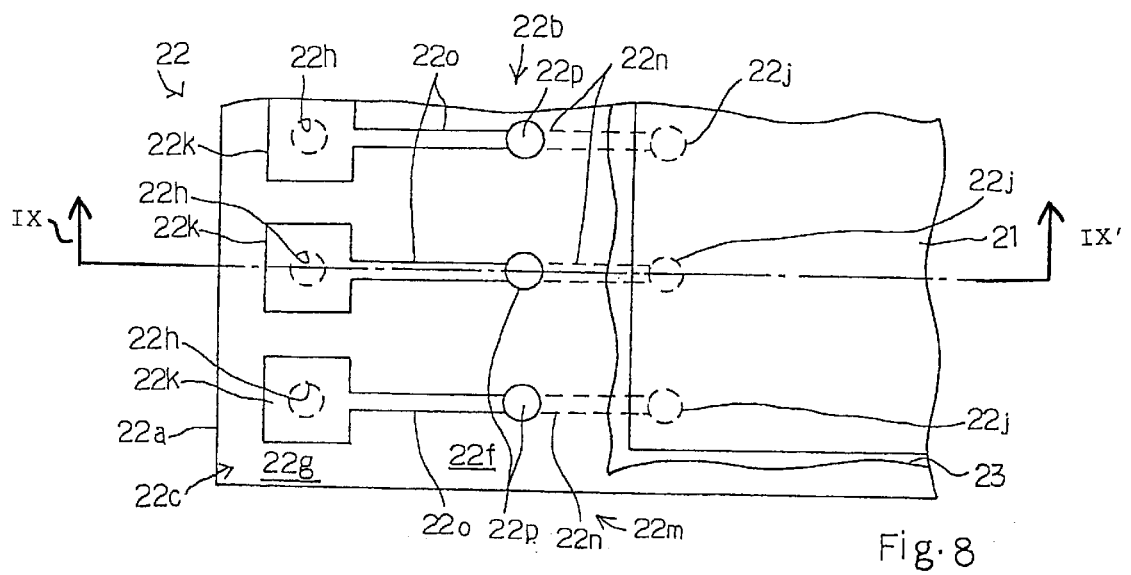
FIG. 8 is a plan view showing the layout of another semiconductor device according to the present invention.
Figure 9:
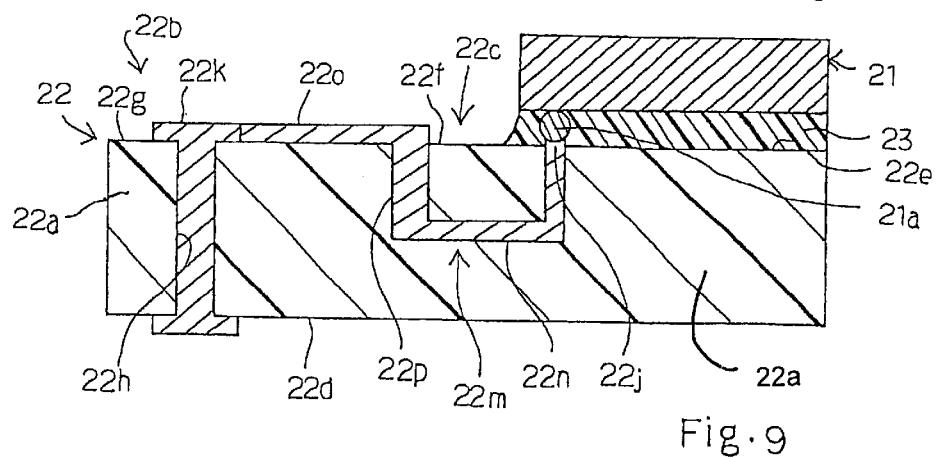
FIG. 9 is a cross sectional view taken along line IX–IX' of FIG. 8 and showing the structure of the semiconductor device.

Turning to FIGS. 8 and 9 of the drawings, a semiconductor chip 21 is mounted on a semiconductor chip carrier 22 embodying the present invention, and synthetic resin 23 fills the gap between the semiconductor chip 21 and the semiconductor chip carrier 22.

The semiconductor chip carrier 22 also includes an insulating resin layer 22a and a conductive pattern 22b. The insulating resin layer 22a has a major surface 22c and a reverse surface 22d, and the major surface 22c is divided into a mounting area 22e, an inner peripheral area 22f and an outer peripheral area 22g. Though-holes 22h are formed in the outer peripheral area 22g, and are open to the major surface 22c and the reverse surface 22d.

The conductive pattern 22b includes pads 22j, vertical interconnections 22k and a circuit sub-pattern 22m. The pads 22j are partially embedded into the insulating resin layer 22a, and are exposed to the mounting area 22e. Bumps 21a are arranged on the lower surface of the semiconductor chip 21, and the bumps 21a are bonded to the pads 22j, respectively. There is no conductive pattern 22b in the mounting area 22e. The vertical interconnections 22k pass the through-holes 22h, respectively, and are exposed to the major surface 22c and the reverse surface 22d.

The circuit sub-pattern 22m is connected at one end to the lower ends of the pads 22j and at the other end to the upper ends of the vertical interconnections 22k. The circuit sub-pattern 22m is twice bent so as to partially extend on the inner peripheral area 22f. In other words, the circuit sub-pattern 22m has a buried portion 22n extending under the major surface 22c, an exposed portion 22o extending on the inner peripheral portion 22f and a vertical connection 22p between the buried portion 22n and the exposed portion 22o. In this instance, the exposed portion 22o is selectively broken so as to change the function of the semiconductor chip 21.

Figure 10:
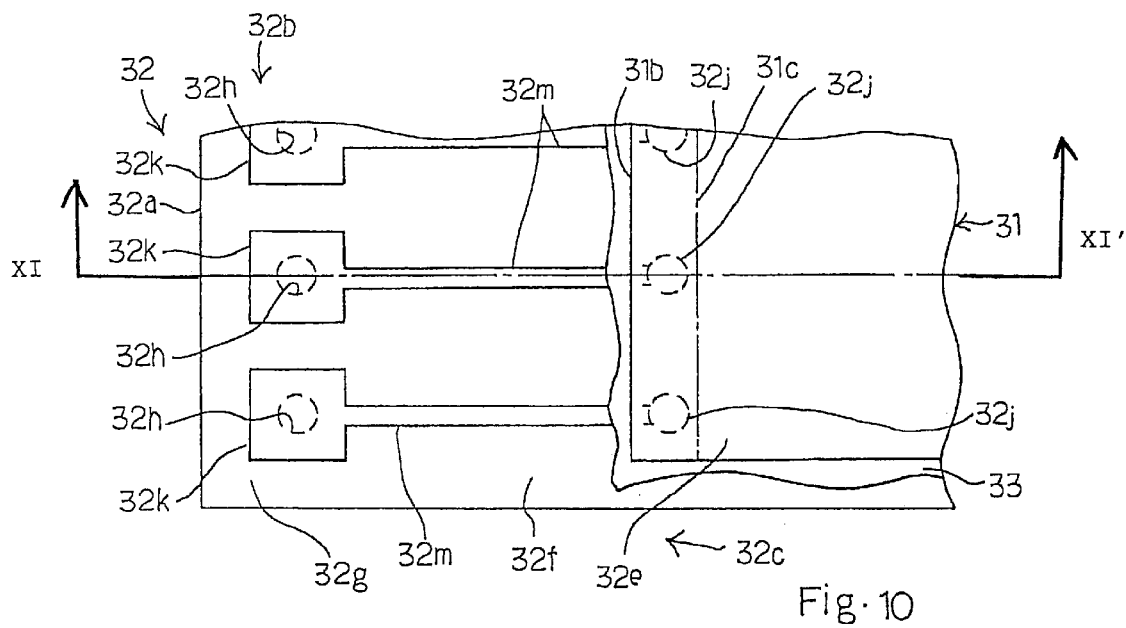
FIG. 10 is a plan view showing the layout of yet another semiconductor device according to the present invention.
Figure 11:
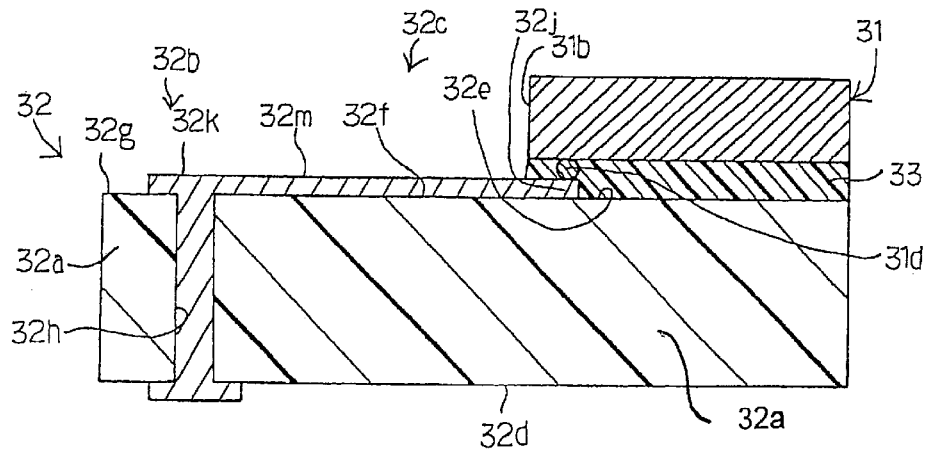
FIG. 11 is a cross sectional view taken along line XI–XI' of FIG. 10 and showing the structure of the semiconductor device.

Turning to FIGS. 10 and 11 of the drawings, a semiconductor chip 31 is mounted on a semiconductor chip carrier 32 embodying the present invention, and synthetic resin 33 fills the gap between the semiconductor chip 31 and the semiconductor chip carrier 32.

The semiconductor chip carrier 32 also includes an insulating resin layer 32a and a conductive pattern 32b. The insulating resin layer 32a has a major surface 32c and a reverse surface 32d, and the major surface 32c is divided into a mounting area 32e, an inner peripheral area 32f and an outer peripheral area 32g. Though-holes 32h are formed in the outer peripheral area 32g, and are open to the major surface 32c and the reverse surface 32d.

The conductive pattern 32b includes pads 32j, vertical interconnections 32k and a circuit sub-pattern 32m. The pads 32j are arranged in a narrow peripheral sub-area of the mounting area 32e, and the narrow peripheral sub-area is defined between one side edge line 31b of the semiconductor chip 31 and a virtual line 31c extending in parallel to the side edge line 31b and coinciding with the end of the circuit sub-pattern underneath the semiconductor chip 31. Bumps 31d are arranged on the lower surface of the semiconductor chip 31, and the bumps 31d are bonded to the pads 32j, respectively. There is no conductive pattern 32b in the mounting area 32e. The vertical interconnections 32k pass the through-holes 32h, respectively, and are exposed to the major surface 32c and the reverse surface 32d.

The circuit sub-pattern 32m is connected at one end to the pads 32j and at the other end to the upper ends of the vertical interconnections 32k. The circuit sub-pattern 32m extends on the inner peripheral area 32f. In this instance, the circuit sub-pattern 32m is selectively broken so as to change the function of the semiconductor chip 31.

Figure 12:
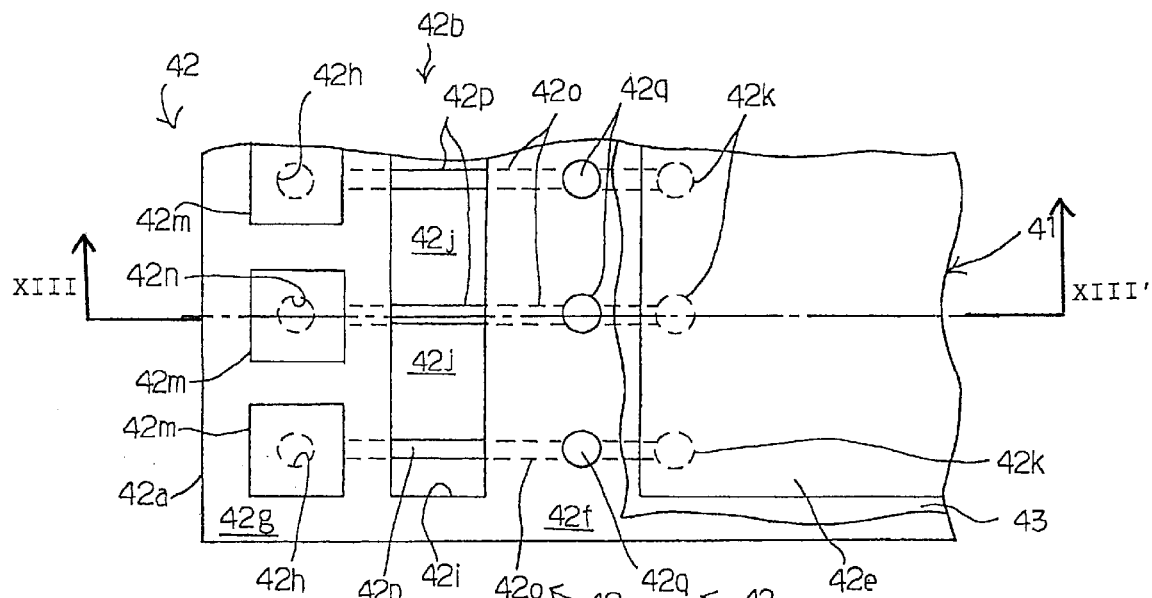
FIG. 12 is a plan view showing the layout of still another semiconductor device according to the present invention.
Figure 13:
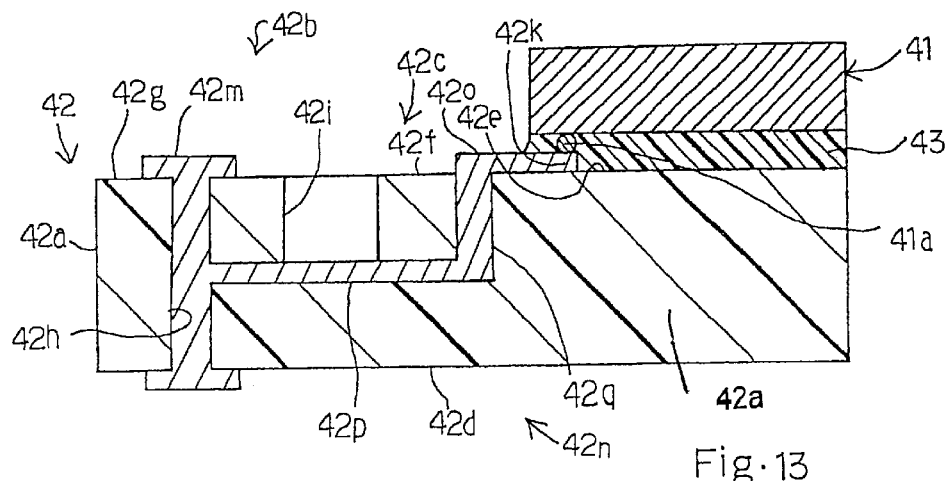
FIG. 13 is a cross sectional view taken along line XIII–XIII' of FIG. 12 and showing the structure of the semiconductor device.

Turning to FIGS. 12 and 13 of the drawings, a semiconductor chip 41 is mounted on a semiconductor chip carrier 42 embodying the present invention, and synthetic resin 43 fills the gap between the semiconductor chip 41 and the semiconductor chip carrier 42.

The semiconductor chip carrier 42 also includes an insulating resin layer 42a and a conductive pattern 42b. The insulating resin layer 42a has a major surface 42c and a reverse surface 42d, and the major surface 42c is divided into a mounting area 42e, an inner peripheral area 42f and an outer peripheral area 42g. Though-holes 42h are formed in the outer peripheral area 42g, and are open to the major surface 42c and the reverse surface 42d. A rectangular window 42i is formed in the inner peripheral area 42f, and an inner surface 42j is exposed to the rectangular window 42i.

The conductive pattern 42b includes pads 42k, vertical interconnections 42m and a circuit sub-pattern 42n. The pads 42k are formed on the mounting, area 42e, and are concentrated in the narrow sub-area as similar to the pads 32j shown in FIG. 11. Bumps 41a are arranged on the lower surface of the semiconductor chip 41, and the bumps 41a are bonded to the pads 42k, respectively. There is no conductive pattern 42b in the mounting area 42e.

The vertical interconnections 42m pass the through-holes 42h, respectively, and are exposed to the major surface 42c and the reverse surface 42d.

The circuit sub-pattern 42n is connected at one end to the pads 42k and at the other end to the intermediate portions of the vertical interconnections 42m. The circuit sub-pattern 42n is twice bent so as to be partially embedded under the inner peripheral area 42f. In other words, the circuit sub-pattern 42n has an exposed portion 42o extending on the major surface 22c, a buried portion 42p extending under the inner peripheral portion 42f and a vertical connection 42q between the buried portion 42p and the exposed portion 42o. In this instance, the buried portion 42p is partially exposed to the rectangular window 42i, and is selectively broken so as to change the function of the semiconductor chip 41.

Figure 14:
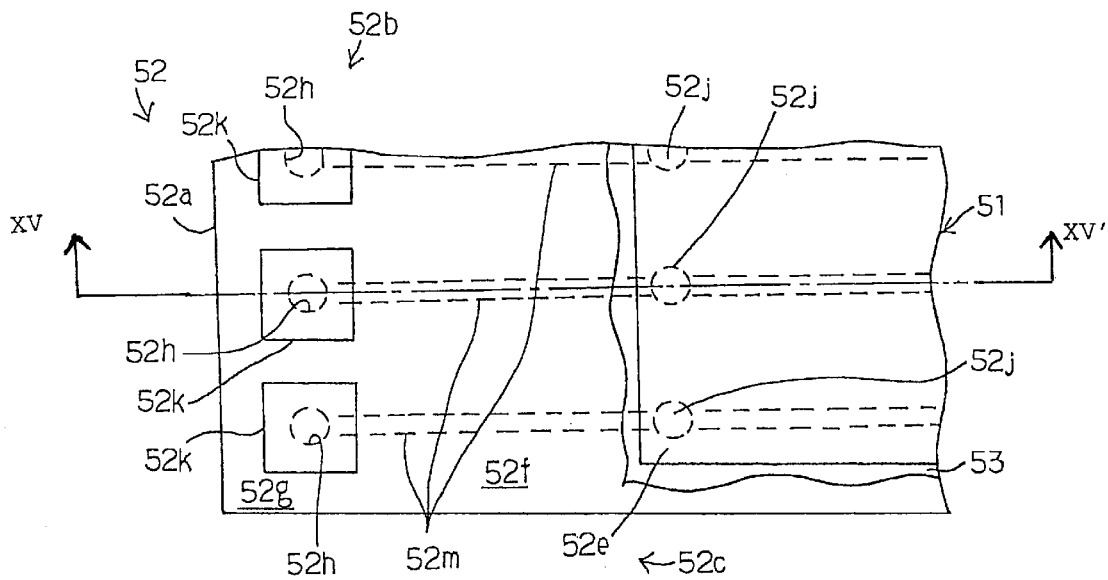
FIG. 14 is a plan view showing the layout of yet another semiconductor device according to the present invention.
Figure 15:
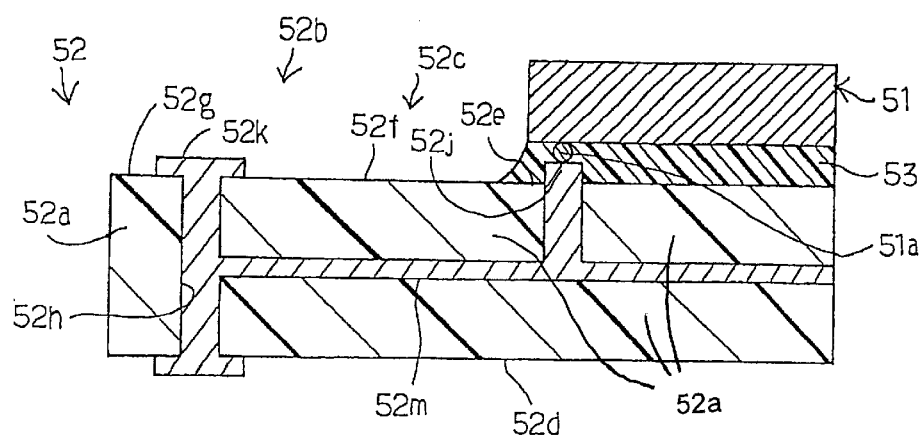
FIG. 15 is a cross sectional view taken along line XV–XV' of FIG. 14 and showing the structure of the semiconductor device.

Turning to FIGS. 14 and 15 of the drawings, a semiconductor chip 51 is mounted on a semiconductor chip carrier 52 embodying the present invention, and synthetic resin 53 fills the gap between the semiconductor chip 51 and the semiconductor chip carrier 52.

The semiconductor chip carrier 52 also includes an insulating resin layer 52a and a conductive pattern 52b. The insulating resin layer 52a has a major surface 52c and a reverse surface 52d, and the major surface 52c is divided into a mounting area 52e, an inner peripheral area 52f and an outer peripheral area 52g. Though-holes 52h are formed in the outer peripheral area 52g, and are open to the major surface 52c and the reverse surface 52d.

The conductive pattern 52b includes pads 52j, vertical interconnections 52k and a circuit sub-pattern 52m. The pads 52j are partially embedded into the insulating resin layer 52a, and are exposed to the mounting area 52e. Bumps 51a are arranged on the lower surface of the semiconductor chip 51, and the bumps 51a are bonded to the pads 52j, respectively. There is not any piece of conductive pattern 52b in the mounting area 52e. The vertical interconnections 52k pass the through-holes 52h, respectively, and are exposed to the major surface 52c and the reverse surface 52d.

The circuit sub-pattern 52m extends under the major surface 52c, and is connected at one end to the intermediate portions of the vertical interconnections 52k and at the intermediate portion to the lower ends of the pads 52j. Thus, the circuit sub-pattern 52m is buried under the major surface 52c except for the contact portions of the pads 52j, and the synthetic resin 53 smoothly flows into the gap between the mounting area 52e and the lower surface of the semiconductor chip 51.

Figure 16:
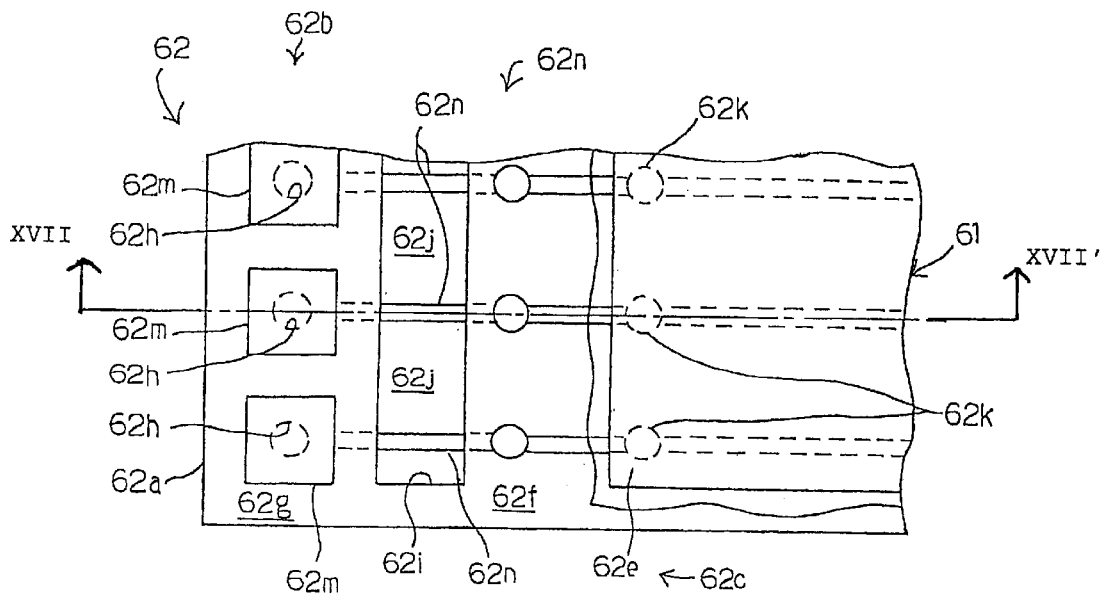
FIG. 16 is a plan view showing the layout of still another semiconductor device according to the present invention.
Figure 17:
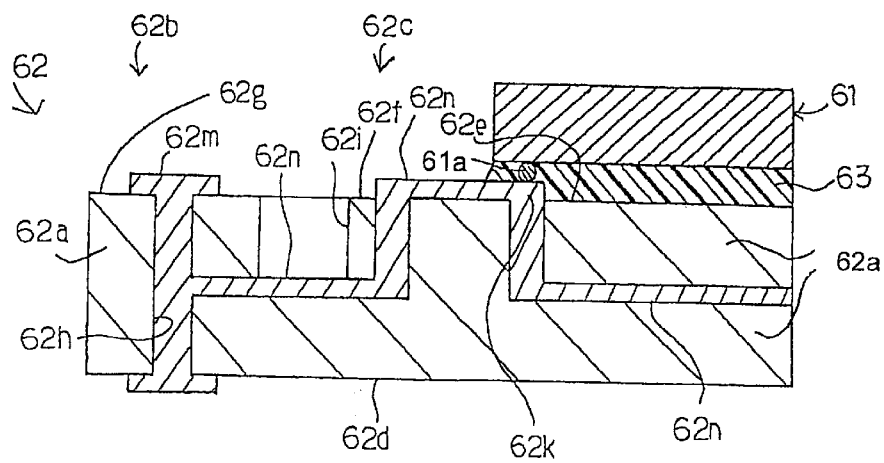
FIG. 17 is a cross sectional view taken along line XVII–XVII' of FIG. 16 and showing the structure of the semiconductor device.

Turning to FIGS. 16 and 17 of the drawings, a semiconductor chip 61 is mounted on a semiconductor chip carrier 62 embodying the present invention, and synthetic resin 63 fills the gap between the semiconductor chip 61 and the semiconductor chip carrier 62.

The semiconductor chip carrier 62 also includes an insulating resin layer 62a and a conductive pattern 62b. The insulating resin layer 62a has a major surface 62c and a reverse surface 62d, and the major surface 62c is divided into a mounting area 62e, an inner peripheral area 62f and an outer peripheral area 62g. Though-holes 62h are formed in the outer peripheral area 62g, and are open to the major surface 62c and the reverse surface 62d. A rectangular window 62i is formed in the inner peripheral area 62f, and an inner surface 62j is exposed to the rectangular window 62i.

The conductive pattern 62b includes pads 62k, vertical interconnections 62m and a circuit sub-pattern 62n. The pads 62k are partially buried in the insulating resin layer 62a, and are exposed to the mounting area 62e. Bumps 61a are arranged on the lower surface of the semiconductor chip 61, and the bumps 61a are bonded to the pads 62k, respectively. There is not any piece of conductive pattern 62b in the mounting area 62e, and the synthetic resin 63 smoothly flows into the gap between the mounting area 62e and the lower surface of the semiconductor chip 61.

The vertical interconnections 62m pass the through-holes 62h, respectively, and are exposed to the major surface 62c and the reverse surface 62d.

The circuit sub-pattern 62n is connected at one end to the upper contact portions of the pads 62k and at the intermediate portion to the intermediate portions of the vertical interconnections 62m. The circuit sub-pattern 62n is twice bent so as to be partially embedded under the inner peripheral area 62f, and is further twice bent so as to extend under the mounting area 62e. In this instance, the circuit sub-pattern 62n is exposed to the rectangular window 62i, and is selectively broken so as to change the function of the semiconductor chip 61.

As will be appreciated from the foregoing description, the conductive pattern is not present in the mounting area except for the pads and the connecting portions of the circuit sub-pattern, and, for this reason, the synthetic resin smoothly flows into the gap under the semiconductor chip without a void being formed. Thus, the synthetic resin layer is prevented from forming a void, and the synthetic resin layer and the semiconductor chip are thus not subjected to the cracking problem discussed in the prior art.

Although particular embodiments of the present invention have been shown and described, it will be apparent to those skilled in the art that various changes and modifications may be made without departing from the spirit and scope of the present invention.

For example, the broken conductive portion may enable selected circuit components, or deselect certain circuit components from an electric circuit. The window shape may also not be a rectangle.

The insulating resin layer may be replaced with an insulating ceramic layer, or an insulating glass layer.

What is claimed is:

1. A semiconductor device comprising:
   a semiconductor chip having a plurality of internal circuit components forming an electric circuit and having a plurality of conductive contacts on a lower surface for external mounting and electrical connection of said semiconductor chip;
   a semiconductor chip carrier for mounting and electrically connecting said semiconductor chip, said chip carrier comprising an insulating layer having a major surface and a reverse surface,
     said major surface comprising a mounting area, an outer peripheral area, and an inner peripheral area,
     said mounting area being located on one end of said major surface for mounting said semiconductor chip, and having a perimeter defined by projections of sides of said semiconductor chip onto said mounting area,
     said outer peripheral area being located at an opposite end of said major surface outside of said mounting area and having a plurality of through holes open to said major surface and to said reverse surface, and
     said inner peripheral area being located intermediate to said mounting area and said outer peripheral area;
   a conductive pattern in contact with said insulating layer, said conductive pattern comprising a plurality of conductive pads, a plurality of vertical conductive interconnects, and a plurality of circuit sub-patterns,
     said plurality of conductive pads being located in said mounting area for aligning with and bonding to associated conductive contacts of said plurality of conductive contacts such that each of said plurality of conductive pads correspoends to a location of one of said associated conductive contacts, and defining positions within said mounting area of a plurality of connections between said plurality of conductive pads and said plurality of conductive contacts, wherein said mounting area within said perimeter of said semiconductor chip is substantially free of conductive material intermediate said semiconductor chip and said major surface other than said plurality of connections,
     said plurality of vertical conductive interconnects passing through and filling said plurality of through holes, and providing a plurality of surface electrical contacts located on each of said outer peripheral area and said reverse surface,
     said plurality of circuit sub-patterns each electrically connecting an associated one of said plurality of conductive pads to an associated one of said plurality of vertical conductive interconnects; and
   a sealant layer comprising a single material and completely filling a space defined between said lower surface and said perimeter of said mounting area, and completely surrounding said plurality of connections, said sealant layer being free of voids within said space, whereby heat transfer between said semiconductor chip and said chip carrier is improved, and cracking of said plurality of connections is reduced.

2. The semiconductor device of claim 1, wherein said insulating layer is one of synthetic resin, ceramic, and glass.

3. The semiconductor device of claim 1, wherein at least one circuit sub-pattern of said plurality of circuit sub-patterns is located on said inner peripheral area, said at least one circuit sub-pattern further comprising a sub-pattern end portion,
   said sub-pattern end portion extending into and ending in said mounting area underneath said semiconductor chip, and having one of said plurality of conductive pads located on said circuit sub-pattern end portion in a sub-region defined between a side edge of the semiconductor chip and a line coincident with the end of said end portion.

4. The semiconductor device of claim 1, wherein at least one circuit sub-pattern of said plurality of circuit sub-patterns further comprises:
   a first portion located on and extending along said inner peripheral area; and
   a second portion embedded in said insulating layer underneath said inner peripheral area, said first portion and said second portion being electrically connected by a first vertical connection embedded in said insulating layer.

5. The semiconductor device of claim 4, wherein said second portion extends underneath said mounting area, and said second portion and said one of said plurality of conductive pads are electrically connected by a second vertical connection embedded in said insulating layer underneath said mounting area.

6. The semiconductor device of claim 4, wherein said first portion further comprises a sub-pattern end portion extending into and ending in said mounting area underneath said semiconductor chip, and having said one of said plurality of conductive pads located on said sub-pattern end portion in a sub-region defined between a side edge of said semiconductor chip and a line coincident with the end of said sub-pattern end portion.

7. The semiconductor device of claim 1, wherein at least one circuit sub-pattern of said plurality of circuit sub-patterns is embedded in said insulating layer underneath said inner peripheral area, and extends at least partially underneath said mounting area, said at least one circuit sub-pattern being electrically connected to one of said plurality of conductive pads by a vertical connection embedded in said insulating layer underneath said mounting area, and said plurality of conductive pads each being exposed in said mounting area for receiving an associated one of said conductive contacts of said semiconductor chip.

8. The semiconductor device of claim 4, further comprising a recessed window located in a region of said inner peripheral area over said at least one circuit sub-pattern, said recessed window exposing an inner surface of said at least one circuit sub-pattern, and wherein said inner surface forms a bottom of said recessed window.

9. The semiconductor device of claim 7, further comprising a recessed window located in a region of said inner peripheral area over said at least one circuit sub-pattern, said recessed window exposing an inner surface of said at least one circuit sub-pattern, and wherein said inner surface forms a bottom of said recessed window.

10. The semiconductor device of claim 8, wherein said recessed window is generally rectangular in shape.

11. The semiconductor device of claim 9, wherein said recessed window is generally rectangular in shape.

12. The semiconductor device of claim 8, wherein said at least one circuit sub-pattern is selectively disconnected at a location of said recessed window.

13. The semiconductor device of claim 9, wherein said at least one circuit sub-pattern is selectively disconnected at a location of said recessed window.

14. The semiconductor device of claim 12, wherein said recessed window is filled by a synthetic resin, said synthetic resin being designed and adapted to prevent contamination and deterioration of said circuit sub-pattern by metal migration.

15. The semiconductor device of claim 13, wherein said recessed window is filled by a synthetic resin, said synthetic resin being designed and adapted to prevent contamination and deterioration of said circuit sub-pattern by metal migration.

16. The semiconductor device of claim 13, wherein said at least one circuit sub-pattern extends completely underneath said mounting area.

17. The semiconductor device of claim 1, wherein said sealing layer is synthetic resin.

18. A semiconductor chip carrier for mounting a semiconductor chip having conductive contacts, said chip carrier comprising:

an insulating layer having a major surface and a reverse surface,
said major surface comprising a mounting area, an outer peripheral area, and an inner peripheral area,
said mounting area being located on one end of said major surface for mounting the semiconductor chip, and having a perimeter defined by projections of the sides of the semiconductor chip onto said mounting area,
said outer peripheral area being located at an opposite end of said major surface outside of said mounting a re a and having a plurality of through holes open to said major surface and to said reverse surface, and
said inner peripheral area being located intermediate to said mounting area and said outer peripheral area; and a conductive pattern in contact with said insulating layer, said conductive pattern comprising a plurality of conductive pads, a plurality of vertical conductive interconnects, and a plurality of circuit sub-patterns,
said plurality of conductive pads being located in said mounting area for aligning and bonding with associated conductive contacts of the semiconductor chip such that each of said plurality of conductive pads corresponds to a location of one of the associated conductive contacts, wherein said mounting area within said perimeter of said semiconductor chip is substantially free of any material intermediate the semiconductor chip and said major surface other than said plurality of conductive pads,
said plurality of vertical conductive interconnects passing through and filling said plurality of through holes, and providing a plurality of surface electrical contacts located on each of said outer peripheral area and said reverse surface, and
said plurality of circuit sub-patterns each electrically connecting an associated one of said plurality of conductive pads to an associated one of said plurality of vertical conductive interconnects.

* * * * *